US010566789B2

(12) United States Patent
Ming Pui et al.

(10) Patent No.: US 10,566,789 B2
(45) Date of Patent: Feb. 18, 2020

(54) APPARATUS FOR PROVIDING ELECTRICITY WITH A PLURALITY OF AC-DC REGULATORS

(71) Applicant: Pismo Labs Technology Limited, Cheung Sha Wan (HK)

(72) Inventors: Chong Ming Pui, Kowloon (HK); Tam Man Fai, Kowloon (HK); Su Kang Yin, North Point (HK); Zhang Jinbiao, Kowloon (HK)

(73) Assignee: Pismo Labs Technology Limited, Cheung Sha Wan (CN)

( * ) Notice: Subject to any disclaimer, the term of this patent is extended or adjusted under 35 U.S.C. 154(b) by 0 days.

(21) Appl. No.: 15/766,152

(22) PCT Filed: Dec. 15, 2016

(86) PCT No.: PCT/IB2016/057668
§ 371 (c)(1),
(2) Date: Apr. 5, 2018

(87) PCT Pub. No.: WO2018/109527
PCT Pub. Date: Jun. 21, 2018

(65) Prior Publication Data
US 2019/0123557 A1    Apr. 25, 2019

(51) Int. Cl.
*H02J 1/12* (2006.01)
*G01R 19/165* (2006.01)
(Continued)

(52) U.S. Cl.
CPC .......... *H02J 1/12* (2013.01); *G01R 19/16528* (2013.01); *H02J 1/14* (2013.01); *H02J 1/08* (2013.01)

(58) Field of Classification Search
CPC ........ H02J 1/08; H02J 1/12; H02J 1/14; H02J 5/00; H02J 9/02; G01R 19/16528
(Continued)

(56) References Cited

U.S. PATENT DOCUMENTS

2002/0135235 A1    9/2002  Winick et al.

FOREIGN PATENT DOCUMENTS

WO    2007088387 A1    8/2007
WO    2010029375 A1    3/2010

OTHER PUBLICATIONS

International Search Report in International Application No. PCT/IB2016/057668, dated Sep. 1, 2017.
(Continued)

*Primary Examiner* — Hal Kaplan
(74) *Attorney, Agent, or Firm* — FisherBroyles, LLP

(57) ABSTRACT

The present invention discloses a DC current supply circuit, which comprises a plurality of power connectors; a first and second plurality of multiplexers; a plurality of AC-DC regulators; and an OR-ing circuit. Inputs and outputs of each of the first plurality of multiplexers are connected to live wires of at least two of the plurality of power connectors and to an input of a corresponding AC-DC regulator respectively. Inputs and outputs of each of the second plurality of multiplexers are connected to neutral wires of at least two of the plurality of power connectors and to input of a corresponding AC-DC regulator respectively. Each selector pin of the first plurality of multiplexers is connected to output of a corresponding AC current sensor. Each of selector pins of the second plurality of multiplexers is connected to output of a corresponding AC current sensor. Outputs of the corresponding AC-DC regulators are connected to the OR-ing.

17 Claims, 12 Drawing Sheets

(51) Int. Cl.
*H02J 1/14* (2006.01)
*H02J 1/08* (2006.01)

(58) Field of Classification Search
USPC .......................................................... 307/32
See application file for complete search history.

(56) References Cited

OTHER PUBLICATIONS

Written Opinion of the international Searching Authority in International Application No. PCT/IB2016/057668, dated Sep. 1, 2017.

US 10,566,789 B2

APPARATUS FOR PROVIDING ELECTRICITY WITH A PLURALITY OF AC-DC REGULATORS

TECHNICAL FIELD

The present invention relates in general to the field of power supply devices. More particularly, the present invention discloses a DC current supply circuit comprising a comprises a plurality of power connectors; a first plurality of multiplexers; a second plurality of multiplexers; a plurality of alternative current to direct current (AC-DC) regulators; and an OR-ing circuit.

BACKGROUND ART

Network Mission critical electrical appliances require continuous and stable electricity supply. It is common that an electrical appliance is connected to two or more different electricity supplies. When one or more of the electricity supplies are out of order, the remaining electricity supplies hopefully may have adequate electricity to supply. For electrical appliances that requires direct current (DC) to operate, alternating current (AC) needs to be converted to DC by AC-DC regulators. AC-DC regulators are known to have reliability and stability problem. It is not uncommon to find AC-DC regulators failed while an electrical appliance is in operation.

Further an AC-DC regulator is connected to one electricity supply only. In the case of a failure, including a power failure of one electricity supply or an electricity supply is not connected to the electrical appliance, the corresponding AC-DC regulator to the electricity supply is not being used and become under-utilized. Comparing to normal operation, during a failure, AC-DC regulators of remaining electricity supplies are likely to be under heavier load as the remaining electricity supplies need to supply more power. The heavier load may cause problem with reliability and stability, and may also shorten the lifespan of the AC-DC regulators of remaining electricity supplies.

Further, when in case of a failure due to one or more electricity supplies and/or one or more AC-DC regulators, the remaining electricity supplies may not have enough capacity to supply the electrical appliance or the electrical appliance may not be able to perform functions that require large amount of electricity. When the electrical appliance continues drawing the amount of electricity from the remaining electricity supplies are not able to provide, this may result in safety hazard as it is possible that too much current is drawn from a particular electricity supply or too much load on one or more of the AC-DC regulators.

In the case that the electrical appliance is capable of providing electricity to other devices through power ports of the electrical appliance, the configuration and management of the electrical appliance and the power ports would be time consuming and prone to errors. Further, when redundancy and priority are required, the configuration and management will become more complicated.

SUMMARY OF THE INVENTION

The present invention discloses a DC current supply circuit, which comprises a plurality of power connectors; a first plurality of multiplexers; a second plurality of multiplexers; a plurality of alternative current to direct current (AC-DC) regulators; and an OR-ing circuit. Inputs of each of the first plurality of multiplexers are connected to live wires of at least two of the plurality of power connectors, and output of each of the first plurality of multiplexers is connected to an input of a corresponding AC-DC regulator. The corresponding AC-DC regulator is one of the plurality of AC-DC regulators. Inputs of each of the second plurality of multiplexers are connected to neutral wires of at least two of the plurality of power connectors and output of each of the second plurality of multiplexers is connected to input of a corresponding AC-DC regulator. Each of selector pins of the first plurality of multiplexers is connected to output of a corresponding AC current sensor. Each of selector pins of the second plurality of multiplexers is connected to output of a corresponding AC current sensor. Outputs of the corresponding AC-DC regulators are connected to the OR-ing. Each of the AC current sensor connects to live wire and neutral wire of one of the plurality of power connectors. The number of the plurality of AC-DC regulators is more than the number of the plurality of power connectors.

According to one of the embodiments, the AC current sensors are optocouplers.

According to one of the embodiments, each output of AC-DC regulators is connected to a corresponding direct current (DC) voltage measurement circuit for generating DC voltage information of amount of DC voltage measured. Alternatively, or additionally, each output of AC-DC regulators is connected to a corresponding DC current measurement circuit for generating DC current information of amount of current measured.

According to one of the embodiments, the electric power supply circuit further comprises a processing unit and a non-transitory computer readable storage medium. The DC voltage information and DC current information are received by the processing unit. The processing unit determines status of each power supply based on the AC voltage information and AC current information.

According to one of the embodiments, the electric power supply circuit further comprises a plurality of AC voltage measurement circuits for generating AC voltage information of amount of voltage measured and a plurality of AC current measurement circuits for generating AC current information of amount of current measured.

DETAILED DESCRIPTIONS

Figure 1:
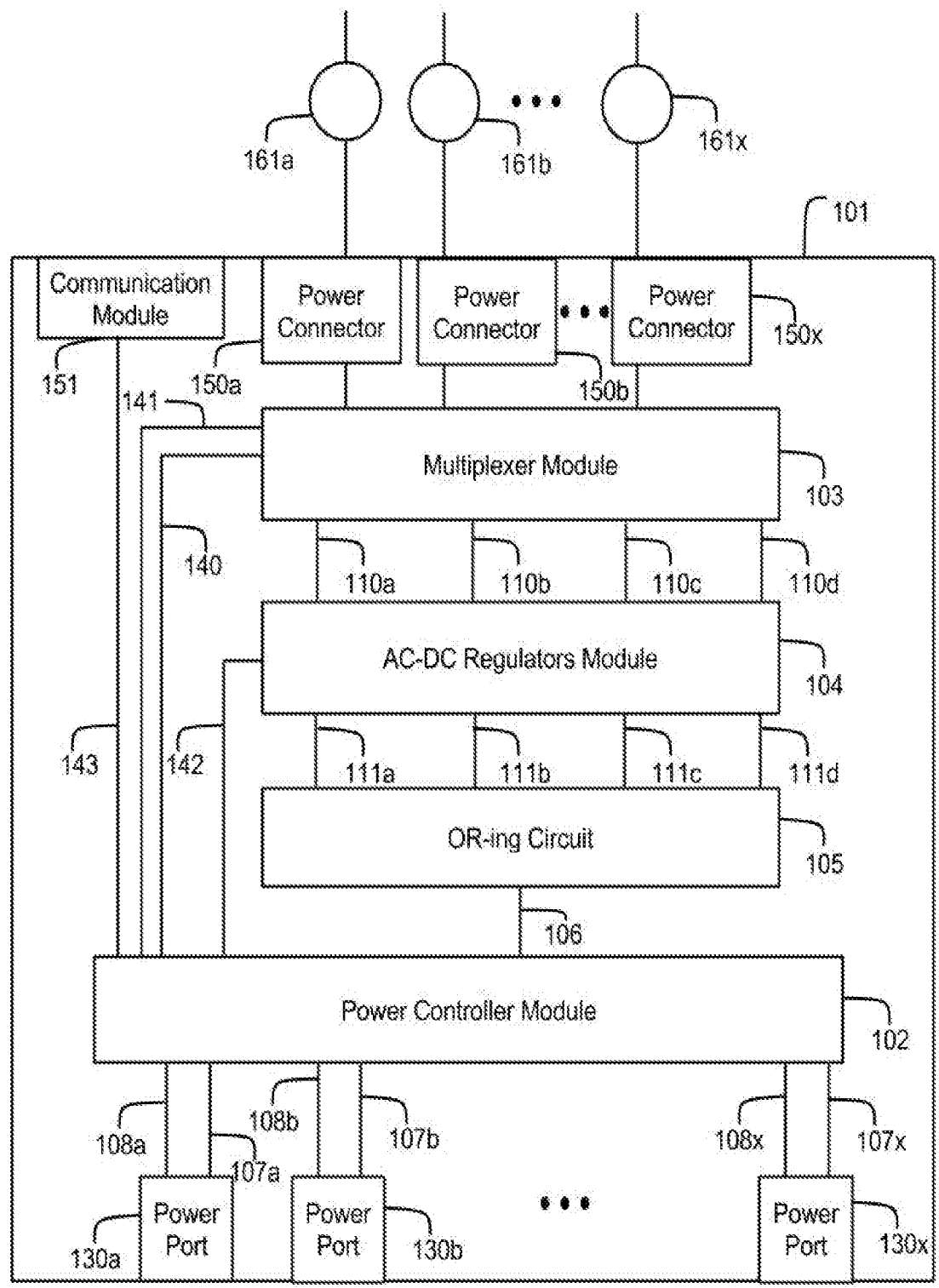
FIG. 1 illustrates a Policy based power supply device (PBPSD) according to one of the embodiments according to the present invention.

The ensuing description provides preferred exemplary embodiment(s) only, and is not intended to limit the scope, applicability or configuration of the invention. Rather, the ensuing description of the preferred exemplary embodiment(s) will provide those skilled in the art with an enabling description for implementing a preferred exemplary embodiment of the invention. It is being understood that various changes may be made in the function and arrangement of elements without departing from the spirit and scope of the invention as set forth in the appended claims.

Specific details are given in the following description to provide a thorough understanding of the embodiments. However, it will be understood by one of ordinary skill in the art that the embodiments may be practiced without these specific details. For example, circuits may be shown in block diagrams in order not to obscure the embodiments in unnecessary detail. In other instances, well-known circuits, processes, algorithms, structures, and techniques may be shown without unnecessary detail in order to avoid obscuring the embodiments.

Also, it is noted that the embodiments may be described as a process which is depicted as a flowchart, a flow diagram, a data flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed, but could have additional steps not included in the figure. A process may correspond to a method, a function, a procedure, a subroutine, a subprogram, etc. When a process corresponds to a function, its termination corresponds to a return of the function to the calling function or the main function.

Embodiments, or portions thereof, may be embodied in program instructions operable upon a processing unit for performing functions and operations as described herein. The program instructions making up the various embodiments may be stored in a storage medium.

The program instructions making up the various embodiments may be stored in a storage medium. Moreover, as disclosed herein, the term "storage medium" may represent one or more devices for storing data, including read-only memory (ROM), programmable read-only memory (PROM), erasable programmable read-only memory (EPROM), random access memory (RAM), magnetic RAM, core memory, floppy disk, flexible disk, hard disk, magnetic tape, CD-ROM, flash memory devices, a memory card and/or other machine readable mediums for storing information. The term "machine-readable medium" includes, but is not limited to portable or fixed storage devices, optical storage mediums, magnetic mediums, memory chips or cartridges, wireless channels and various other mediums capable of storing, containing or carrying instruction(s) and/or data. A machine-readable medium can be realized by virtualization, and can be a virtual machine readable medium including a virtual machine readable medium in a cloud-based instance.

The term computer-readable medium, primary storage medium, main memory, or secondary storage, as used herein refers to any medium that participates in providing instructions to a processing unit for execution. The processing unit reads the data written in the primary storage medium and writes the data in the secondary storage medium. Therefore, even if the data written in the primary storage medium is lost due to a momentary power failure and the like, the data can be restored by transferring the data held in the secondary storage medium to the primary storage medium. The computer-readable medium is just one example of a machine-readable medium, which may carry instructions for implementing any of the methods and/or techniques described herein. Such a medium may take many forms, including but not limited to, non-volatile media, volatile media, and transmission media. Non-volatile media includes, for example, optical or magnetic disks. Volatile media includes dynamic memory. Transmission media includes coaxial cables, copper wire and fiber optics. Transmission media can also take the form of acoustic or light waves, such as those generated during radio-wave and infrared data communications.

A volatile storage may be used for storing temporary variables or other intermediate information during execution of instructions by a processing unit. A non-volatile storage or static storage may be used for storing static information and instructions for processor, as well as various system configuration parameters.

The storage medium may include a number of software modules that may be implemented as software codes to be executed by the processing unit using any suitable computer instruction type. The software code may be stored as a series of instructions or commands, or as a program in the storage medium.

Various forms of computer readable media may be involved in carrying one or more sequences of one or more instructions to the processor for execution. For example, the instructions may initially be carried on a magnetic disk from a remote computer. Alternatively, a remote computer can load the instructions into its dynamic memory and send the instructions to the system that runs one or more sequences of one or more instructions.

A processing unit may be a microprocessor, a microcontroller, a digital signal processor (DSP), any combination of those devices, or any other circuitry configured to process information.

A processing unit executes program instructions or code segments for implementing embodiments of the present invention. Furthermore, embodiments may be implemented by hardware, software, firmware, middleware, microcode, hardware description languages, or any combination thereof. When implemented in software, firmware, middleware or microcode, the program instructions to perform the necessary tasks may be stored in a computer readable storage medium. A processing unit(s) can be realized by virtualization, and can be a virtual processing unit(s) including a virtual processing unit in a cloud-based instance.

Embodiments of the present invention are related to the use of a computer system for implementing the techniques described herein. In an embodiment, the inventive processing units may reside on a machine such as a computer platform. According to one embodiment of the invention, the techniques described herein are performed by computer system in response to the processing unit executing one or more sequences of one or more instructions contained in the volatile memory. Such instructions may be read into the volatile memory from another computer-readable medium. Execution of the sequences of instructions contained in the volatile memory causes the processing unit to perform the process steps described herein. In alternative embodiments, hard-wired circuitry may be used in place of or in combination with software instructions to implement the invention. Thus, embodiments of the invention are not limited to any specific combination of hardware circuitry and software.

A code segment, such as program instructions, may represent a procedure, a function, a subprogram, a program, a routine, a subroutine, a module, a software package, a class, or any combination of instructions, data structures, or program statements. A code segment may be coupled to another code segment or a hardware circuit by passing and/or receiving information, data, arguments, parameters, or memory contents. Information, arguments, parameters, data, etc. may be passed, forwarded, or transmitted via any suitable means including memory sharing, message passing, token passing, network transmission, etc.

Alternatively, hardwired circuitry may be used in place of, or in combination with, software instructions to implement processes consistent with the principles of the invention. Thus, implementations consistent with principles of the invention are not limited to any specific combination of hardware circuitry and software.

A network interface may be implemented by a standalone electronic component or may be integrated with other electronic components. A network interface may have no network connection or at least one network connection depending on the configuration. A network interface may be an Ethernet interface, a frame relay interface, a fiber optic interface, a cable interface, a Digital Subscriber Line (DSL) interface, a token ring interface, a serial bus interface, a universal serial bus (USB) interface, Firewire interface, Peripheral Component Interconnect (PCI) interface, cellular network interface, etc.

A network interface may connect to a wired or wireless access network. An access network may carry one or more network protocol data. A wired access network may be implemented using Ethernet, fiber optic, cable, DSL, frame relay, token ring, serial bus, USB, Firewire, PCI, or any material that can pass information. A wireless access network may be implemented using infrared, High-Speed Packet Access (HSPA), HSPA+, Long Term Evolution (LTE), WiMAX, General packet radio service (GPRS), Global System for Mobile Communications (GSM), Enhanced Data rates for GSM Evolution (EDGE), Code division multiple access (CDMA), Wi-Fi, CDMA2000, Wideband CDMA (WCDMA), Time Division CDMA (TD-SCDMA), BLUETOOTH, WiBRO, Evolution-Data Optimized (EV-DO); Digital Enhanced Cordless Telecommunications (DECT); Digital AMPS (IS-136/TDMA); Integrated Digital Enhanced (iDEN) or any other wireless technologies. For example, a network interface may be used as a local area network (LAN) interface or a wide area network (WAN) interface.

The term "relay" as disclosed herein represents an electrically operated switch that allows current to flow in a load, depending upon the switch's position or state. A relay can be solid state relay (SSR), mechanical relay, electromechanical relay (EMR) or the SSR which uses power MOSFET in its output elements like, MOSFET relay, photo relay, photo MOS relay, photo MOS switch, photo DMOS-FET relay etc. The relay can be Single and Dual Channel solid state relays in SPST (single pole single throw), SPDT (single pole double throw), DPST (double pole single throw) and DPDT (double pole double throw) combinations, with current ratings all the way from 1.1 mA to 500 A and Isolation Voltage from 200V to 5000V. Nonetheless, relays can "control" larger voltages and amperes by having an amplifying effect because a small voltage applied to a relay's coil can result in a large voltage being switched by the contacts.

As disclosed herein the term "communication module" may represent a transceiver module to provide network capabilities to a power controller or power controller server using 3G, GPRS or GPS modules, through wires or through an Ethernet cable. The communication module lows a processing unit to obtain user information and communications port of the communication module can connect to a personal computer or other power controller or power controller server (PCS) through wires or wirelessly by using serial bus or Ethernet or using 2G/3G/4G or LTE technology. The communication module can be used as a network interface for applications that require data to be shared between a power controller and an intelligent device such as a host computer and/or a server.

The communication module can be an optical data communication system; an opto-electronic transceiver module may include a light source such as a laser, and a light receiver such as a photodiode, and may also include driver and receiver circuitry associated with the laser and photodiode. To use such an opto-electronic transceiver module, an optical fiber cable is plugged into a port in the module. Such a module also includes electrical contacts that can be coupled to an external electronic system.

Embodiments, or portions thereof, may be embodied in a computer data signal, which may be in any suitable form for communication over a transmission medium such that it is readable for execution by a functional device (e.g., processing unit) for performing the operations described herein. The computer data signal may include any binary digital electronic signal that can propagate over a transmission medium such as electronic network channels, optical fibers, air, electromagnetic media, radio frequency (RF) links, and the like, and thus the data signal may be in the form of an electrical signal, optical signal, radio frequency or other wireless communication signal, etc. The code segments may, in certain embodiments, be downloaded via computer networks such as the Internet, an intranet, LAN, metropolitan area network (MAN), wide area network (WAN), the public switched telephone network (PSTN), a satellite communication system, a cable transmission system, and/or the like.

Voltage measurement circuit (VMC) can be realized by using an integrated circuit or part of an integrated circuit. Current measurement circuit (CMC) can also be realized by using an integrated circuit or part of an integrated circuit.

According to one of the embodiments of the present invention, an electrical appliance is comprised of a plurality of power connectors that it can receive electricity from a plurality of electricity supplies. The plurality of electricity supplies allows the electrical appliance to have redundant electricity supply to increase reliability. The plurality of electricity supplies also allows the electrical appliance to receive the amount of electricity that is more than one single power supply is capable of supplying.

The electrical appliance is further comprised of a plurality of AC-DC regulators. The AC-DC regulators is used to convert AC current supplied by the electricity supplies to DC current used by different parts of the electrical appliance or devices connecting to the electrical appliance. It is known that AC-DC regulators are prone to fail. The plurality of AC-DC regulators allows the electrical appliance to have redundant AC-DC regulators to increase reliability. In order to further increase the reliability, the number of AC-DC regulators is preferred to be more than the number of power connectors and each AC-DC regulator is not restricted to connect to one AC-DC regulator only. A multiplexer is placed between one AC-DC regulator and at least two electricity supplies. A processing unit controls the switch, which allows one of the at least two electricity supplies to provide electricity to the AC-DC regulator.

The amount of electricity that the electrical appliance is configured to consume is substantially based on power policy and the amount of electricity that the plurality of power supplies can supply.

Power policy is used to mainly configure an electrical appliance (i) the priority of distributing among its own parts and/or connected devices when the amount of electricity received is not adequate and (ii) the level of redundancy of electricity supply. The power policy can be entered by an administrator or a user directly at the electrical appliance through an input of the electrical appliance. The power policy can also be retrieved by the electrical appliance from a remote device. When the power policy is set to have high redundancy, the amount of electricity allowed to be consumed or distributed by the electrical appliance is lowered.

When redundancy of the power policy is set to n+1 redundancy, one of the electricity supplies is used for redundancy and one of the AC-DC regulators is also used for redundancy. For illustration purpose, an electrical appliance has three electricity supplies; so that the electrical appliance can consume power up to the capacity of two electricity supplies and have one electricity supply to give redundancy if an electricity supply fails. Similarly, for AC-DC regulators, for illustration purpose, the electrical appliance has three AC-DC regulators; so that the electrical appliance can consume power up to the capacity of two AC-DC regulators and have one AC-DC regulator to give redundancy if another AC-DC regulator fails.

When redundancy of the power policy is set to 2n, half of the electricity supplies is used for redundancy and half of the AC-DC regulators is also used for redundancy. For illustration purpose, an electrical appliance has eight electricity supplies; so that the electrical appliance can consume power up to the capacity of four electricity supplies and have four electricity supply to give redundancy if one or more electricity supply fail. Similarly for AC-DC regulators, for illustration purpose, the electrical appliance has twelve AC-DC regulators; so that the electrical appliance can consume power up to the capacity of six AC-DC regulators and have six AC-DC regulators to give redundancy if one or more AC-DC regulator fail.

FIG. 1 illustrates one of the embodiments according to the present invention. Policy based power supply device (PBPSD) 101 is an electrical appliance and is capable of connecting to one or more power supplies 161. Power supplies 161 are AC power supply and can be at different voltages and can be single phase or three phases. The number of power supplies 161 is not limited and is depending on the number of power connectors 150, multiplexers inside of multiplexer module 103, AC-DC regulators inside AC-DC regulators module 104. Each of power connectors 150 is connected to one of power supplies 161 respectively. For a single phase AC power supply, live wire and neutral wire of each of power connector 150 are connected to two multiplexers inside multiplexer module 103 respectively. The ground wire of each of power connector 150 is connected to the case of PBPSD 101 for safety reasons.

Multiplexer module 103 has a plurality of multiplexers inside. A multiplexer is capable of connecting to two or more power connectors 150. A multiplexer is controlled by the status of one of power supplies 161. One of the power supplies connected to a multiplexer is also used to control the multiplexer to choose which of power supplies is connected to the output of the switch. For illustration purposes only, a multiplexer is connected to live wire of power supply 161 *a* if power supply 161 *a* is providing electricity and connected to power connector 150 *a*. On the other hand, the multiplexer is connected to live of power supply 161 *b* if power supply 161 *a* is not providing electricity.

Between power connectors 150 and multiplexer module 103, voltage measurement circuits and current measurement circuits may be deployed to measure voltages and currents supplies by each of power supplies 161. The voltage measurements and current measurements are sent to power controller module 102 for processing. Such that, power controller module 102 is able to determine status of each of power supplies 161. Power controller module 102 is able to detect which of power supplies 161 is supply electricity and whether amount of current from a power supply has reached the limit of the power supply. In one variant, the voltage measurements circuits and current measurements circuits are integrated in power connectors 150. Further, based on fluctuations of voltage supplied by power supplies 161, power controller module 102 is able to determine whether any of power supplies 161 is not operating stably.

A power connector is connected to one or more multiplexers in multiplexer module 103. Preferably, a power connector is connected to a plurality of multiplexers in multiplexer module 103 in order to distribute loading of AC-DC regulators and reduce the impact when one or more of power supplies 161 fail. Multiplexers should be connected to power connectors 150 evenly assuming failure rates of power supplies 161 are about the same. For example, the number of multiplexers connected to power connector 150*a* should be about the same number of multiplexers connected to power connector 150*b*. In another illustration, if there are three multiplexers connected to power connector 150*a*, the number of multiplexers connected to power connector 150*b* is preferred to be two to four.

There are four pairs of wires 110*a*-110*d* connecting multiplexer module 103 to AC-DC regulators module 104. For readability, only one line is drawn for each of 110*a*-110*d* to represent a pair of wires. Each pair of wires 110*a*-110*d* has one wire for live and one wire for neutral. The number of pairs of wires 110*a*-110*d* depending on the number of multiplexers in multiplexer module 103 and AC-DC regulators in AC-DC regulators module 104. For illustration purpose, only four lines 110*a*-110*d* are illustrated but there is no limitation that there can only be four pairs.

Power controller module 102 is able to select the connection between a power connector and an AC-DC regulator through a multiplexer. This allows connecting more than one AC-DC regulator to a power connection. This also allows an AC-DC regulator to switch to another power connector without shutting down the electrical appliance.

Similarly, there are four pairs of wires 111 *a*-111 *d* connecting AC-DC regulators in AC-DC regulators module 104 to OR-ing circuit 105. For readability, only one line is drawn for each of 111 *a*-111 *d* to represent a pair of wires. Each pairs of wires 111 *a*-111 *d* has one wire for live and one wire for neutral. The number of pairs of wires 111 *a*-111 *d* depending on the number of AC-DC regulators in AC-DC regulators module 104. For illustration purposes, only four pairs of wires are illustrated but there is no limitation that there can only be four pairs.

The outputs of AC-DC regulators in AC-DC regulators module 104 are DC current. The OR-ing circuit 105 allows paralleling power supplies from AC-DC regulators for protecting against interrupted electricity operation due to failures, shorts, hot-plug or removal of one device. The output of OR-ing circuit 105 is connected to power controller module 102 for power distribution to power ports 130, for power consumption of power controller module 102 and other parts of PBPSD 101, including communication module 151 and circuits of multiplexers in multiplexer module 103. In one variance, the output of OR-ing circuit 105 can also be connected to other parts of PBPSD 101 for their consumption. Multiplexer module 103, AC-DC regulators module 104 and OR-ing circuit 105 together allow multiple AC electricity supplies to provide electricity to power controller module 102 and other parts of PBPSD 101; result in higher reliability and redundancy comparing to only have one AC-DC regulator directly supplying power to power controller module 102. There is no limitation that the DC current from output of OR-ing circuit 105 is only provided to elements shown in FIG. 1. For illustration purpose, the DC current can also be provided to devices receiving power from PBPSD 101, light emitting diode (LED), storage medium and memory of PBPSD 101.

Connection 140 is used to carry information from sensors in multiplexer module 103 to power controller module 102. For each of power connectors 150, there is at least one sensor to detect whether electricity is provided through the corresponding power connector. For illustration purposes, a sensor in multiplexer module 103 is able to determine whether electricity is provided through its corresponding power connector 150. Power controller module 102 is then able to determine how many of power connectors 150 are receiving electricity. In one variant, the sensors are located at power connectors 150 instead of in multiplexer module 103.

There is no limitation that there is only one sensor. A plurality of sensors can be used to detect different characteristics of electricity supply through each of power connectors 150, including voltage and current. Further environmental sensors, such as temperature and humidity sensors, can also provide information to power controller module 102 through connection 140. Those who are skilled in the arts who appreciate that connection 140 can be implemented using different wiring techniques and protocols, including general-purpose input/output (GPIO) and Inter-Integrated Circuit (I2C). The choice of sensors includes VMC and the CMC for detecting and measuring electricity supply. Another choice of sensor is an optocoupler for monitoring the presence of voltage.

In one variant, there is no connection 140 or sensors in multiplexer module 103. Multiplexer module 103, AC-DC regulators module 104, OR-ing circuit 105 and power controller module 102 can still operate without knowing whether electricity is provided through a power connector. However, power policy may be affected as power controller module does not know the maximum electricity capacity it can use. Therefore, it is preferred to have the sensors.

Connection 141 is used to control multiplexers based on information from sensors. When power controller module 102 has detected an electricity supply has stopped supplying electricity through the sensors, power controller module 102 controls one or more multiplexers to allow AC-DC regulators which have been receiving electricity from the electricity supply to receive electricity from other electricity supplies. In one variant, power controller module 102 does not control the multiplexers. The multiplexers are controlled by the sensors. For example, when an optocoupler detects no presence of voltage at a default electricity supply of a multiplexer, it sends a signal to the multiplexer. The multiplexer will then switch the input from the default electricity supply to another electricity supply. When the optocoupler detects voltage at the default electricity switch, it sends another signal to the switch. The multiplexer will then switch the input from the another electricity supply back to the default electricity supply.

Connection 142 is used to carry information from sensors in AC-DC regulators module 104 to power controller module 102. For each of AC-DC regulators in AC-DC regulators module 104, there is at least one VMC and one CMC to measure the voltage and current output of the AC-DC regulators. The VMCs and the CMCs can be implemented using one or more integrated circuit, such as LTC 4151 from Linear Technology. Based on the measurement of VMCs and the CMCs, power controller module 102 is then able to determine how much current is supplied by each of AC-DC regulators and if any of the AC-DC regulators is not functioning.

In one variant, when power controller module 102 has detected that the amount of current being drawn from an AC-DC regulator is more than a threshold, power controller module 102 will start a power reduction procedure (PRP) to reduce the amount of current being drawn. It is known that when an AC-DC regulator is supplying current more than its recommended level, it is likely that the AC-DC regulator will start overheating which may result in unstable performance and even shutting down.

Power controller module 102 provides electricity to one or more power ports 130. The number of power ports is not limited to any particular number. It is preferred that the total power consumption by devices connected to power ports 130a-130x is not more than the power that can be delivered by power supplies 161 and within capacity of AC-DC regulators in AC-DC regulators module 104. If there is too much current being drawn, AC-DC regulators may result in shutdown, overheat and/or malfunction. For each power port of power ports 130, there are wire connections 107 for supplying electricity and wire connections 108 for data connection.

There is no limitation to the physical dimension or types of power ports 130. Further, power ports 130 do no need to be the same. For illustration purpose, power port 130a is Power Over Ethernet (POE) port, power port 130b is a RS-232 data console port plus power connection, and power port 130x is a Universal Serial Bus (USB) port that is rated to provide current up to 100 mA and voltage up to 20V. There is no limitation on the amount of current and amount of voltage that can be supplied through power ports 130a. However, the aggregated amount of current supplied through all power ports 130 should be within the aggregated recommended amount of current provided by all AC-DC regulators in AC-DC regulators module 104 in order to reduce overheating and hazard and maintain reliability.

Communication module 151 connects to power controller module 102 through connection 143. Power controller module 102 communicates with other devices for management of PBPSD 101 through communication module 151. Particularly, power controller module 102 retrieves power policies from one or more servers and electronic devices through communication module 151. In one example, a server, reachable through the Internet, stores power policies. When there is a change of power policies, the remote server will notify PBPSD 101 through the Internet, a network or a connection using Internet Protocol (IP). In another example, the server is located at the same local area network (LAN) with PBPSD 101. When the server determines power port 130 *a* should receive electricity, the server will then send a message to PBPSD 101. Power controller module 102 then allows electricity to be provided to power port 130 *a* on the condition that there is adequate amount of electricity. Particularly, for illustration purposes, the server is connected to a smart card system. When the smart card system is able to authenticate a person, the smart card system informs the server about the person. Then the server instructs PBPSD 101 to start providing electricity to power port 130 *a* through communication module 151.

In one variant, communication module 151 is a RS 232 serial port that connects to a motion sensor. When the motion sensor detects a moving object, it sends a message to PBPSD 101 to turn on power port 130*b*, which is connected to a lighting system. Therefore, the lighting system is turned on when a moving object is detected.

Power policy is a set of policies stored in a machine-readable medium that is used for determining how electricity is being provided to each of power ports 130. It can be in a format of strings, XML, JSON or binary. For example, when there is not enough electricity to provide to all power ports 130, power controller module 102 will only enable one or more of power ports based on the power policy. Specifically, when there are malfunctions or shutdown of one or more of AC-DC regulators in AC-DC regulators modules 104, power controller module 102 will prioritize the distribution of electricity to power ports 130 based on the power policy. In another illustration, not all power supplies 161 are supplying electricity and therefore power controller module 102 is not able to provide full power to all power ports 130. Power policy can be inputted locally by user or administrator of PBPSD 101, retrieved from a remote server, and/or retrieved from a computing device connected to PBPSD 101.

In one variant, the power policy specifies schedules for turning one or more power ports on and off. In one example, power ports are turned on during office hours and turned off during non-office hours. In another example, power ports are connected to computers and monitors as electricity supply. When a user of a computer and a monitor is in the same premises of where the computer and the monitor are located, the power ports are scheduled to be turned on. When the user leaves the premises, the power ports will be turned off, such that the computer and the monitor will be turned off. This will not only reduce electricity consumption, but also reduce computer security risk while the user is not in the premises. A sensor may be used to detect the presence of the user in the premises and send user presence information to power controller module 102. Then power controller module is able to determine the presence of the user. There are myriad of sensors that are capable of identifying the user. For example, the sensor can be a name card reader placed at the entrance of the premises.

In one variant, the power policy specifies schedules for power cycling one or more power ports. In one example, a power port is turned off for a few seconds at a scheduled time and then is turned on again. This allows a device receiving electricity from the power port to be reset by being turned off and on. In one variant, when there are a plurality of power ports to be reset at about the same time, power controller module 102 will not allow the plurality of power ports to be turned on at the same instant in order to avoid a large amount of current being drawn from power supplies 161 and AC-DC regulators. Instead, power controller module 102 will first turn the plurality of power ports off, and then turn them on one by one, preferably separated by two to five seconds.

In one variant, PBPSD 101 is an Ethernet switch that is capable of providing Ethernet data connectivity and power over Ethernet (PoE). In one variant, PBPSD 101 is an Internet router that is capable of receiving Internet protocol (IP) packets that are encapsulated in Ethernet frames. The Ethernet frames are received and transmitted through the power ports.

Figure 2A:
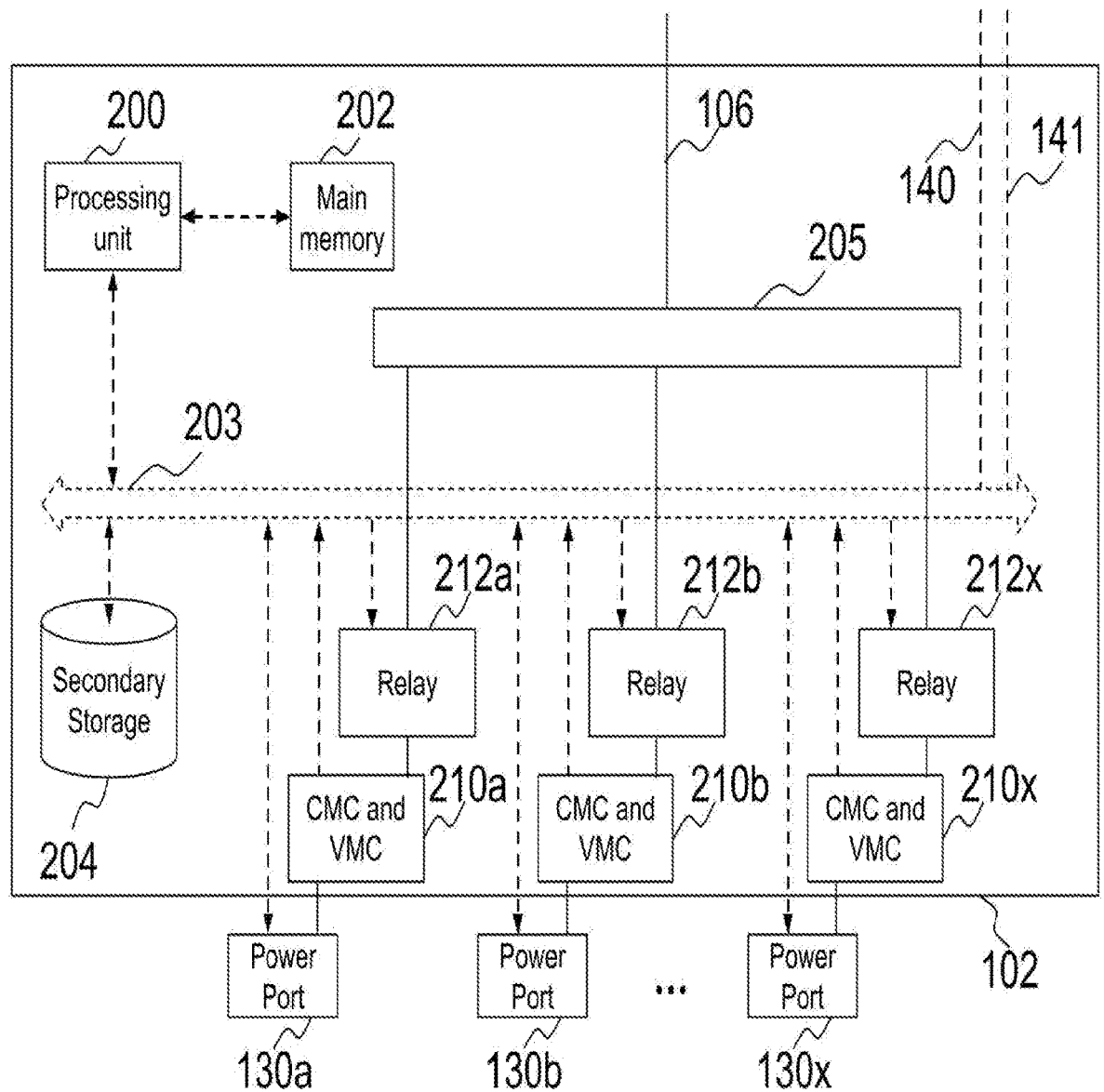
FIG. 2A illustrates one of the embodiments of power controller module 102 of the present invention.

FIG. 2A illustrates one of the embodiments of power controller module 102 of the present invention. In this embodiment, dotted lines represent data connection and solid lines represent power lines. Processing unit 200 is used for controlling electricity supply to power ports 130 and managing data connectivity, such as Ethernet connectivity, to power ports 130. Secondary storage 204 stores the power policies and instructions for processing unit 200. Main memory 202 stores temporary data and instructions for processing unit 200. OR-ing electricity output 106, which is output of OR-ing circuit 105, is connected to power bus 205. Measurement circuits, such as CMC and VMC 210*a*, 210*b*, and 210*x*, which are used to measure current and voltage, can be implemented like those measurement circuits in multiplexer module 103 and/or in AC-DC regulators module 104. There is no limitation that each of CMCs and VMCs 210 must be placed between its corresponding relay and power port. For example, CMC and VMC 210*a* can be placed between power bus 205 and relay 212*a*.

Processing unit 200 determines when to enable and disable relays 212 based on the power policies and information received from measurement circuits, information received from sensors in multiplexer module 103 through connection 140 and information received from CMCs and VMCs in AC-DC regulators module 104 through connection 141. When a relay is enabled, the corresponding power port is able to receive electricity from power bus 205. For illustration purposes, when relay 212 *b* is enabled, power port 130 *b* is then enabled to receive electricity from power bus 205. On the other hand, when a relay is disabled, the corresponding power port will receive no electricity. A power port is still capable of providing data connectivity, such as Ethernet data connection, while the corresponding relay is disabled. This allows the power port can still be used for data connectivity while reducing loading on the AC-DC regulators and power supplies. In one variance, the power port is still capable of providing data connectivity but without PoE. In one variance, when a relay of a power port is disabled, the power port will not be able to provide data connectivity.

Figure 2B:
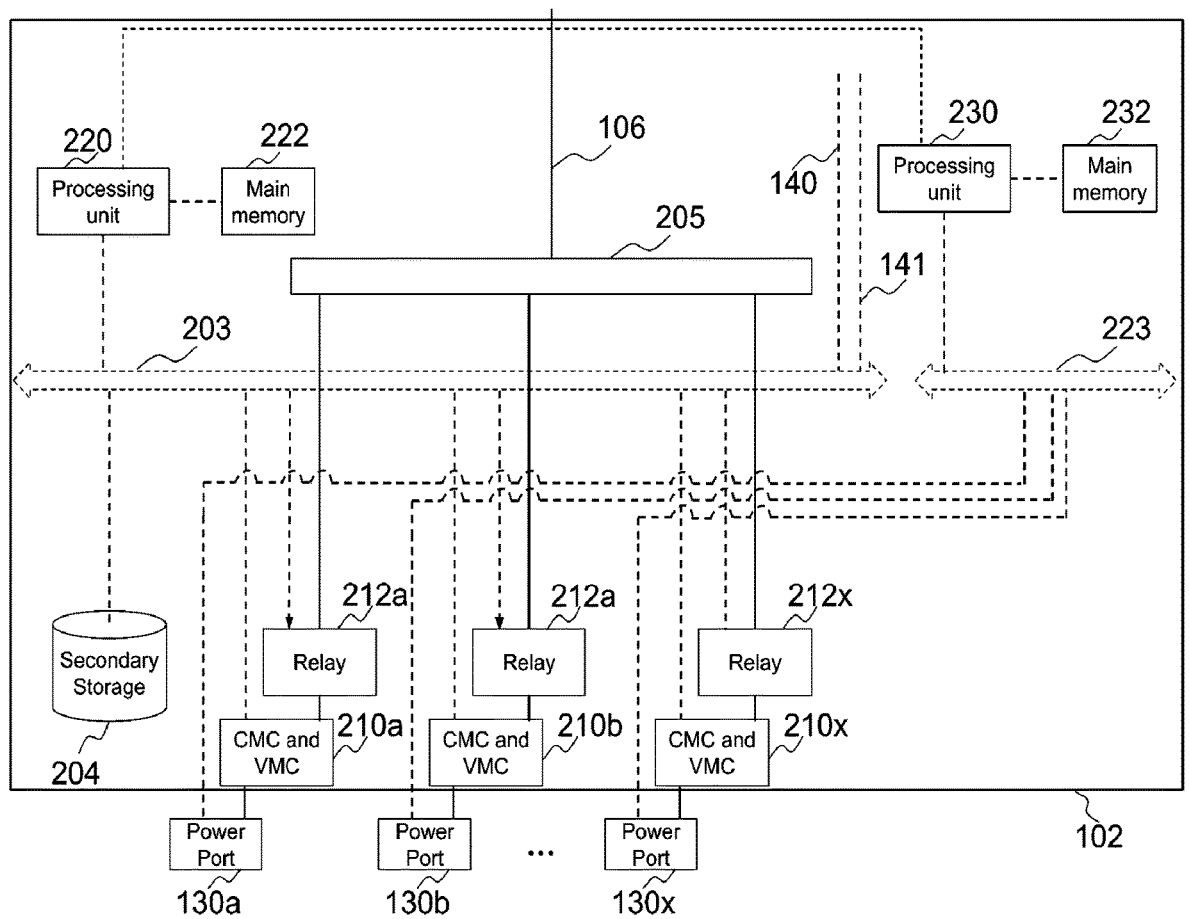
FIG. 2B illustrates one of the embodiments of power controller module 102 of the present invention.

FIG. 2B illustrates one embodiment of power controller module 102 of the present invention. Comparing to embodiments illustrated in FIG. 2A, the functions performed by processing unit 200 are divided between processing units 220 and 230. In this embodiment, processing unit 220 is mainly responsible of determining whether to enable or disable relays 212 based on power policies, information received from sensors and measurements from CMCs and VMCs 210. Processing unit 230 is responsible for managing network traffic, such as switching and routing. Processing unit 220 sends instructions, which includes enabling and disabling relays 212, and data to processing unit 230 through a direct connection or data bus 203. Main memory 222 and 232 provide temporary storages of instructions and data for processing units 220 and 230 respectively.

Figure 2C:
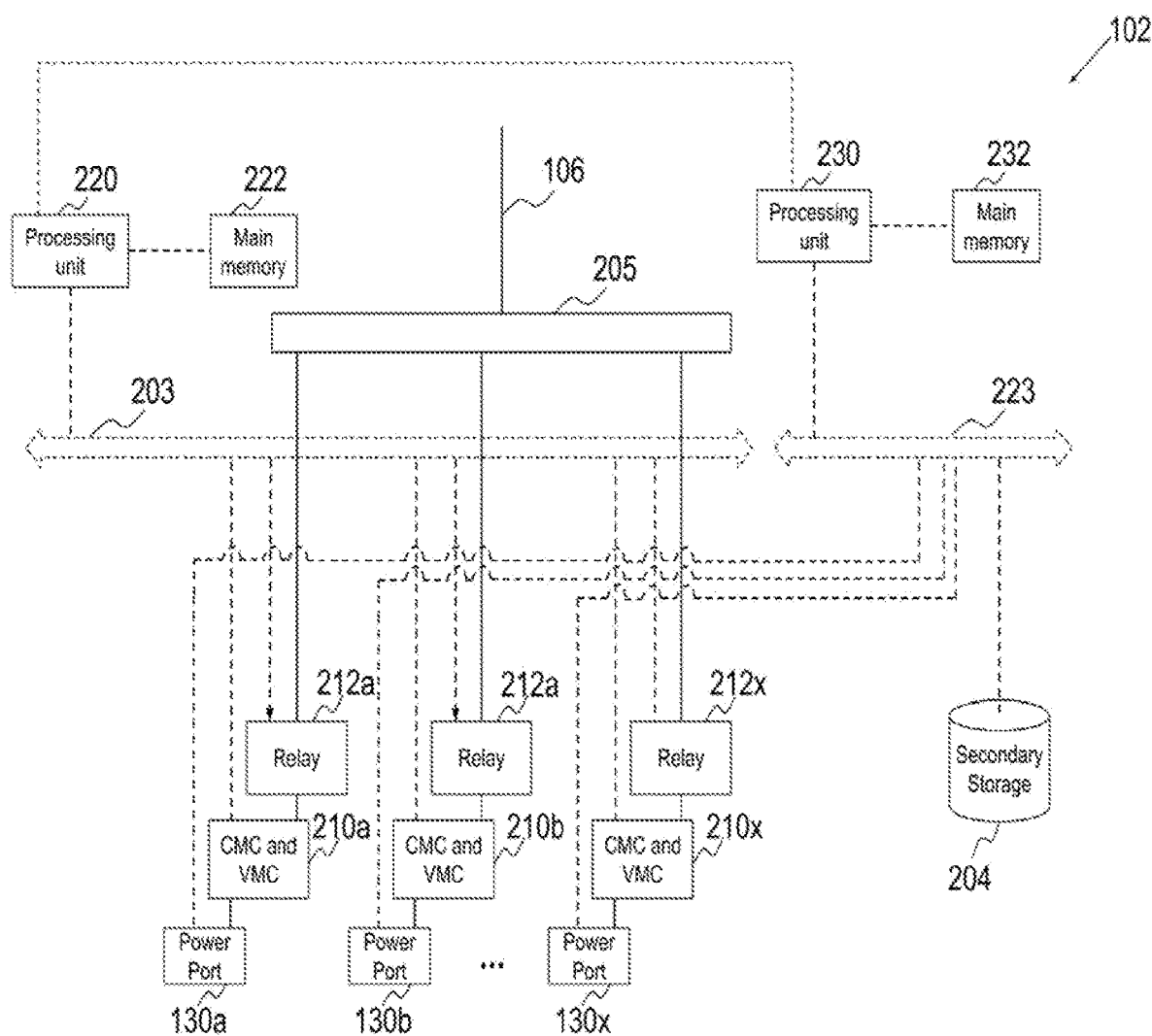
FIG. 2C illustrates one of the embodiments of power controller module 102 of the present invention.

FIG. 2C illustrates one embodiment of power controller module 102 of the present invention. Comparing to embodiments illustrated in FIG. 2A and FIG. 2B, secondary storage 204 is connected to data bus 223. Instructions and power policies are retrieved by processing unit 230 through data bus 223. Processing unit 230 then forwards the instructions, which includes enabling and disabling relays 212, to processing unit 220 or creates new instructions to processing unit 220 based on the retrieved instructions.

Figure 2D:
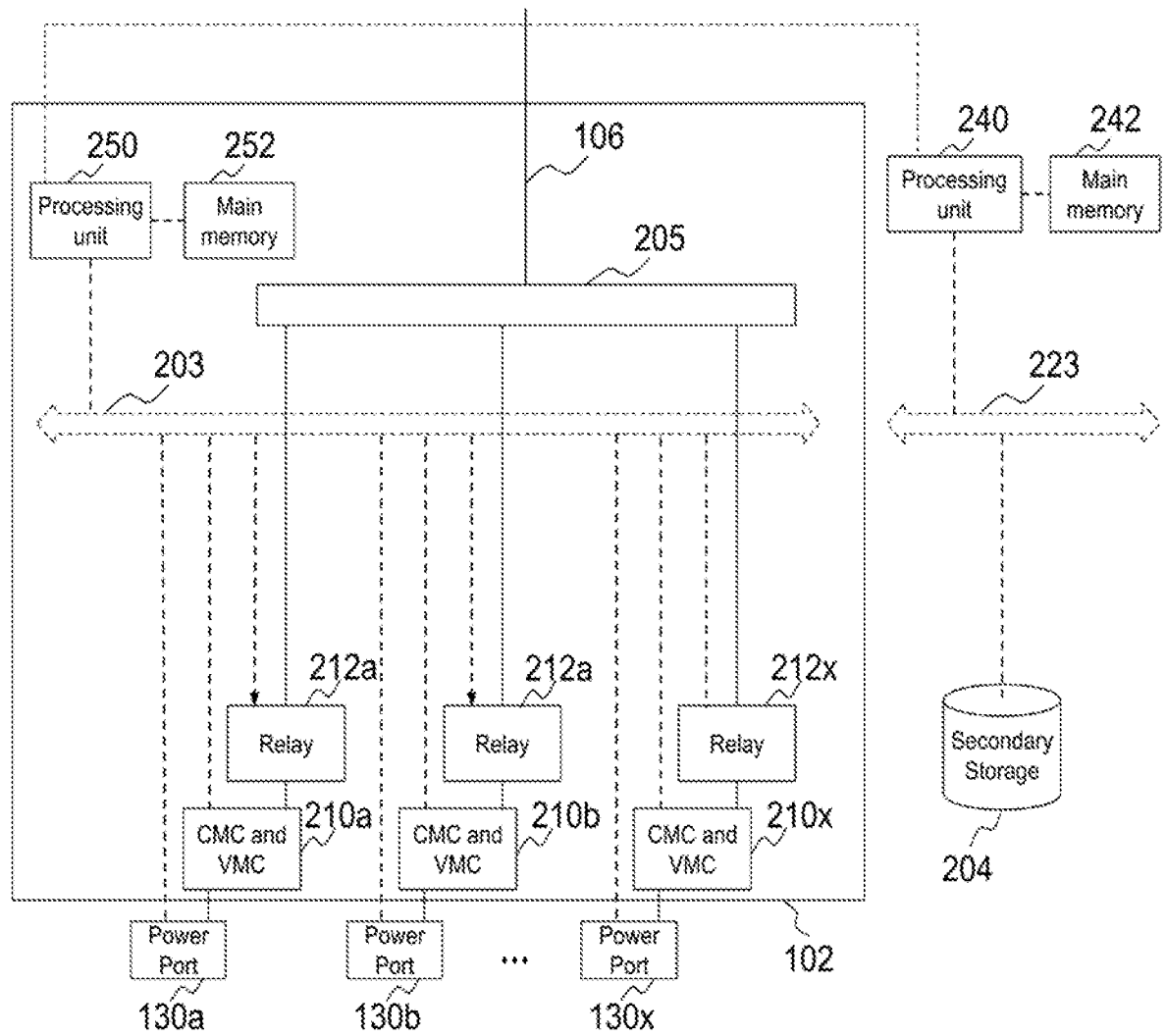
FIG. 2D illustrates one of the embodiments of power controller module 102 of the present invention.

FIG. 2D illustrates one embodiment of power controller module 102 of the present invention. Comparing to embodiments illustrated in FIG. 2A and FIG. 2B, secondary storage 204 is connected to data bus 223. Instructions and power policies are retrieved by processing unit 240 through data bus 223. Processing unit 240 is connected to main memory 242. Processing unit 240 then forwards the instructions, which includes power policy, to processing unit 250 or creates new instructions for processing unit 250 based on the retrieved instructions. The measurements from CMCs and VMCs 210 are retrieved by processing unit 250, which also manages relays 212 a based on the measurements and power policy received from processing unit 240. Processing unit 250 also manages network traffic.

There are no limitations that elements shown in FIG. 2A-2D must be discrete components. The elements can be integrated in one or more circuits or integrated circuits. In one variance, power bus 205, data bus 203, processing unit 250, main memory 252 and relays 212 are realized by one integrated circuit. In one variance, power bus 205 and relays 212 are realized by one integrated circuit.

In one variance, processing unit is part of power controller module that one integrated circuit or one semiconductor chip is capable of providing functionalities of both processing unit and power controller module. Such that there the communication between processing unit and power controller module is being carried out inside the integrated circuit or the semiconductor chip; and processing unit and power controller can share the same non-transitory computer readable storage media.

Figure 5:
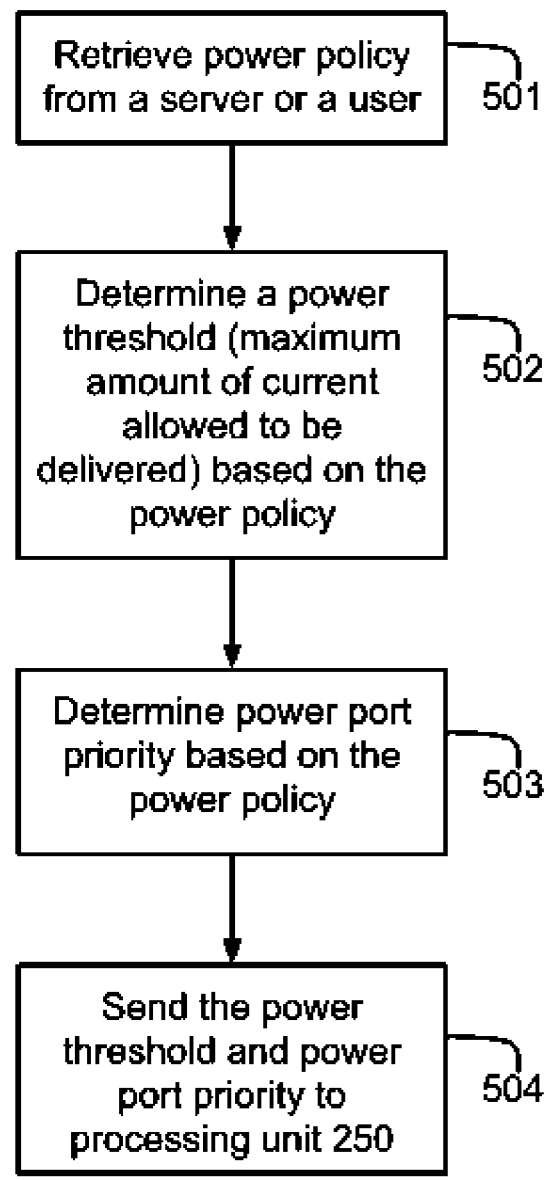
FIG. 5 illustrates a process of one of the embodiments for a power controller module to prioritize electricity supply to power ports.

FIG. 5 illustrates a process of one of the embodiments for power controller module 102 to prioritize electricity supply to power ports 130. FIG. 5 should be viewed in conjunction with FIG. 2D. Power controller module receives power policy through communication module 151 at step 501. It then determines a power threshold in step 502 based on the power policy. The power threshold is used to restrict the maximum total amount of power that can be provided to all power ports 130. There are a few approaches to determine the value of the power threshold.

When the power policy is to provide full power to all power ports 130, power controller module should set the power threshold should be set to a value that all power ports 130 can be powered to its maximum amount of power simultaneously. For example, for illustration purpose, if each of power port 130 is to deliver up to 20 W and there are thirty-two power ports 130, the power threshold should be set to 32 times 20 W, 640 watts.

In another illustration, the maximum amount of power that can be supplied by each of power supplies 161 is nine hundred (900) watts; the maximum amount of power that can be supplied by all power supplies 161 becomes two thousand and seven hundred (2700) watts; PBPSD 101 itself consumes fifty (50) watts. The maximum total amount of power that can be delivered to all power ports 130 becomes 2650 watts at step 502 for full-power power policy.

In one variant, when the power policy is set to be 2n redundancy, that is half of power supplies 161 is reserved for redundancy or backup purposes. The maximum total amount of power that can be delivered to all power ports 130 is the maximum total amount that can be supplied by all power supplies 161 minus the power consumption, 50 watts, and then divided by two. This results in, 2700 watts minus 50 watts and then divided by two, 1325 watts at step 502.

In one variant, when the power policy is set to be 2+1 redundancy, that is one third of power supplies 161 is reserved for redundancy or backup purpose. The maximum total amount of power that can be delivered to all power ports 130 is the maximum total amount of power that can be supplied by all power supplies 161 times two-thirds. This results in, 2700 watts minus 50 watts and then times ⅔, 1766.6 watts at step 502.

In one variant, the power threshold is specifically set at the power policy to be a specific value. In such case, there is no need to calculate the current threshold at PBPSD 101.

At step 503, power port priority is determined based on the power policy. A power port that has a higher priority will be more likely receive electricity comparing to a power port that has a lower priority in case the amount of electricity supplied is not adequate. For illustration purposes, power port 130 a has a higher priority than power port 130 b. When the total amount of power consumed by appliances connected to power ports 130 a and 130 b is less than the power threshold, both power ports 130 a and 130 b will receive electricity. When the total amount of power consumed by appliances connected to power ports 130 a and 130 b is more than the power threshold, power controller module 102 stops providing electricity to power port 130 b in order to conserve power for power port 130 a.

The power port priority is embedded in the power policy. The power port priority can be expressed in the form of strings or binary data. For illustration purposes, a power policy for power ports 130 is "130 a:H, 130 b:L, 130 x:L" where H means high priority and L means low priority. Therefore, power port 130 a has higher priority over power ports 130 b and 130 x. In another illustration, a power policy for power ports 130 is "130 a:3, 130 b:2, 130 x:1" where power port 130 a has priority three comparing to priority two of power port 130 b and priority one of power port 130 x.

At step 504, processing unit 240 sends the power threshold and power port priority to processing unit 250. Processing unit 250 then enables and disables relays 212 based on the power threshold and power port priority, which allows power ports 130 to receive electricity or to not receive electricity.

Figure 6:
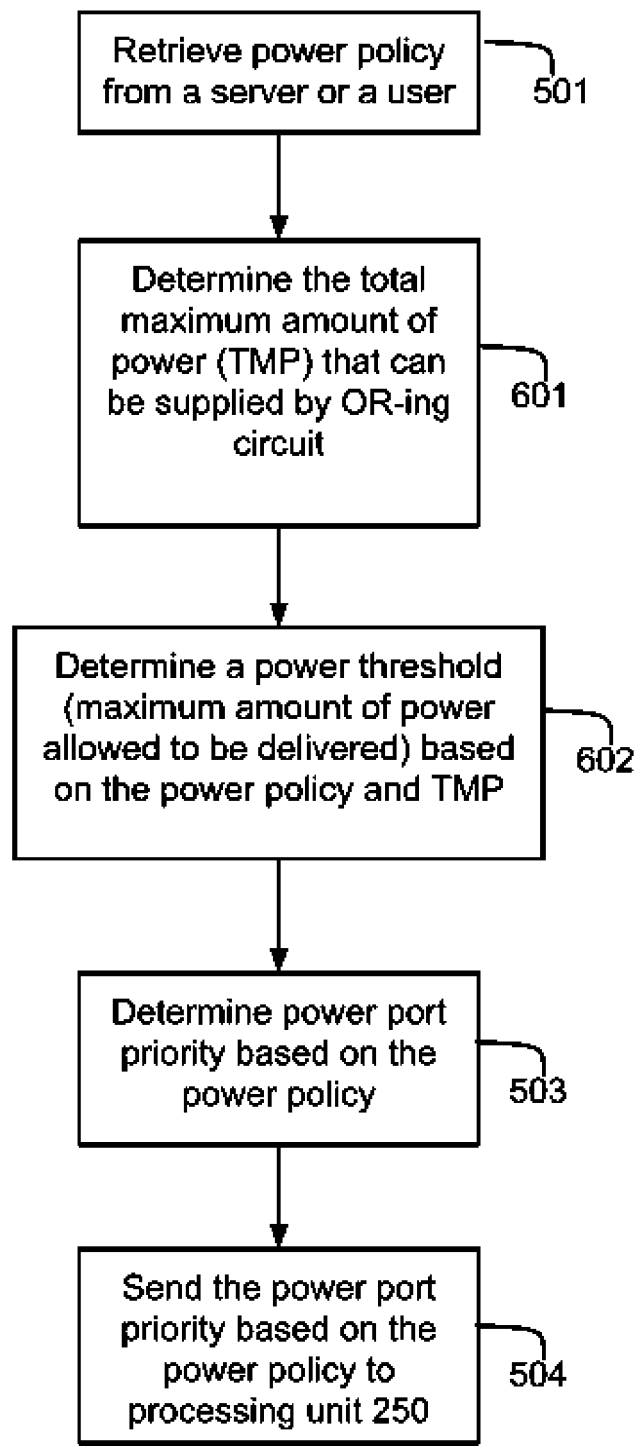
FIG. 6 illustrates a process of one of the embodiments for a power controller module to prioritize electricity supply to power ports.

FIG. 6 illustrates one variant of the process illustrated in FIG. 5. Comparing to FIG. 5, step 601 is added and step 502 is modified to be step 602. At step 601, the total maximum amount of power (TMP) that can be supplied by the OR-ing circuit 105 is determined. TMP is determined substantially based on number of power supplies 161 that are providing electricity and status of AC-DC regulators in AC-DC regulators module 104. When one or more power supplies 161 are not providing electricity or are not being plugged with power connectors 150, corresponding AC-DC regulators module 104 will not receive the electricity. Further, when one or more AC-DC regulators in AC-DC regulators module 104 are out of order, OR-ing circuit 105 may receive less amount of electricity than OR-ing circuit 105 is capable of handling and results in less power being delivered to power ports 130. The amount of power preferred to be provided to the OR-ing circuit 105 is not more than the maximum amount of recommended power that can be converted by all operating AC-DC regulators together. The amount of power that can be provided by OR-ing circuit 105 to power ports 130 should be the amount of power received by OR-ing minus the amount of power expected to be consumed by PBPSD 101.

In one illustration, when power supplies 161a, 161b and 161x are plugged to power connectors 150 respectively and each power supply is providing 900 W, TMP becomes 2650 W as the total supplied power is 2700 W and PBPSD 101 itself consumes about 50 W. In another example, when only one power supply 161a is plugged to power connectors 150a, TMP becomes 850 W as 900 W minus 50 W for power consumption of PBPSD 101. In another example, when power supplies 161a, 161b and 161x are plugged to power connectors 150 respectively and only two AC-DC regulators are in operation, TMP becomes 1750 W as 1800 W minus 50 W for power consumption of PBPSD 101. The two AC-DC regulators convert AC current from two of power supplies 161a, 161b and 161x to DC current while one of power supplies 161a, 161b and 161x is not being used.

Although it is possible to have a power supply to provide more electricity than it is designed or to have an AC-DC regulator to convert more amount of AC current, it is not preferred as this may cause fuse blowing and safety hazard.

At step 602, a power threshold is determined substantially based on the power policy and TMP. Comparing to step 502, power threshold is also determined based on TMP. By using TMP, the power supply status and an AC-DC regulators operation status are taken into the account when determining the power threshold. For example, when power policy is set to full power, which is 2650 W, and the TMP is determined to be 1750 W, the power threshold will become 1750 W. In the case the power policy is set to one-to-one or 2n redundancy and TMP is determined to be 1750 W, the power threshold will be 875 W, which is 1750 W divided by two.

One of the main benefits of using TMP when determining power threshold is to reduce the risk of too much power being drawn by power ports 130. If power threshold is set more than TMP, it is possible that too much power is drawn from power supplies 161 or AC-DC regulators and results in safety hazard. For illustration purposes, power threshold is set to 1750 W but TMP is only 850 W as only one AC-DC regulator in AC-DC regulators module 104 is functioning. When the total power consumption is less than 850 W, the AC-DC regulator is able to handle the AC-DC conversion. When total power consumption is raised to 1000 W, for example, the AC-DC regulator, which is only able to handle 900 W conversion, will likely overheat, cause safety hazard and shut down.

Steps 503 and 504 in the process illustrated in FIG. 6 are the same as steps 503 and 504 in the process illustrated in FIG. 5.

The TMP is set when PBPSD 101 is being powered-up. During the power-up or initialization stage, power controller module 102 determines TMP. When PBPSD 101 receives a new power policy and/or has detected changes in power supply stability, number of operating power supplies, AC-DC regulator stability, and number of operating AC-DC regulators, power controller module 102 may adjust TMP.

The number of AC-DC regulators inside AC-DC regulators module 104 is preferred to be equal to or more than the number of power supplies 161. A multiplexer inside multiplexer module 103 allows its corresponding AC-DC regulator inside AC-DC regulator module 104 to be selected to connect to one of at least two of power supplies 161. Particularly, power inputs of a multiplexer are connected to one default power supply and at least one alternative power supply while the power output of the multiplexer is connected to a corresponding AC-DC regulator. When the default power supply is providing electricity, the multiplexer is connected to the default power supply and therefore the corresponding AC-DC regulator is connected to the default power supply. When the default power supply is not providing electricity, the multiplexer will not connect to the default power supply, but instead connect to one of at least one alternative power supplies and therefore the corresponding AC-DC regulator is connected to the one of at least one alternative power supplies. Through a switch, an AC-DC regulator is able to connect to a power supply that is providing electricity and results in higher redundancy of power supply. There is no limitation to the number of alternative power supplies can be connected to a switch.

For illustration purpose, power inputs of a multiplexer are connected to power supplies 161 a, 161 b and 161 x. The default power supply is power supply 161 a while the alternative power supplies are power supplies 161 b and 161 x. When power supply 161 a is providing electricity, the multiplexer is connected to power supply 161 a and therefore its corresponding AC-DC regulator is receiving electricity from power supply 161 a through power output of the switch. When power supply 161 a is not providing electricity, the multiplexer is then connected to one of power supplies 161 b and 161 x and therefore its corresponding AC-DC regulator will receive electricity from one of power supplies 161 b and 161 x through power output of the switch. In one variant, when power supply 161 a is not providing electricity, the multiplexer is capable of switching to one of power supplies 161 b and 161 x that is providing electricity. An electricity sensing circuit will detect which of power supplies 161 a, 161 b and 161 x is providing electricity and then will provide a signal to the multiplexer for connecting to the power supply that is providing electricity. One of the choices for such electricity sensing circuit is optocoupler.

Figure 3:
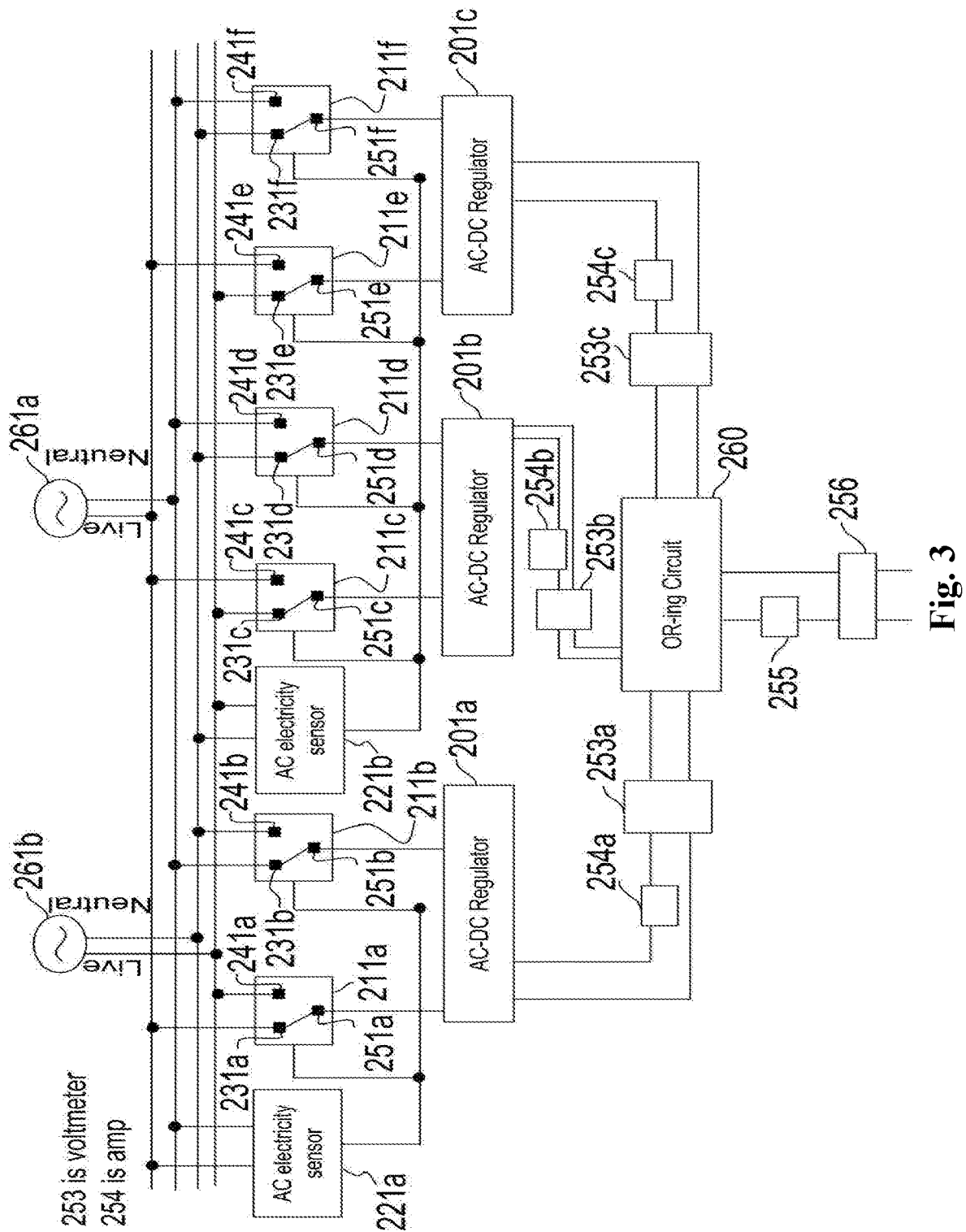
FIG. 3 illustrates a circuit schematic diagram of PBPSD 101 according to one of the embodiments of the present invention.

FIG. 3 illustrates a circuit schematic diagram of PBPSD 101 according to one of the embodiments of the present invention. The embodiment illustrated in FIG. 3 corresponds to FIG. 1. A plurality of AC power supplies 261a-261b are connected to an OR-ing circuit through a plurality of AC-DC regulators 201a-201c and multiplexers 211a-211f for increasing power supply redundancy. Each of AC-DC regulators 201a-201c is connected to a pair of multiplexers 211a-211f Multiplexers 211a-211f are controlled by an output of AC electricity sensor 221a or 221b. Inputs of AC electricity sensors 221a-221b are connected to either AC power supply 261a or 261b for detecting whether AC power supplies 261a-261b are providing electricity. Each of multiplexers is connected to either live wires of AC power supplies 261a and 261b or neutral wires of AC power supplies 261a and 261b.

The use of a plurality of AC-DC regulators 201 a-201 c allows loading of converting AC current to DC current to be spread out among AC-DC regulators 201 a-201 c. This helps extending the lifespan of AC-DC regulators 201 a-201 c as they are not pushing to their operation limits frequently and also helps improving of reliability compared to using fewer AC-DC regulators. Another benefit for using a multiplexer to connect AC-DC regulators 201 a-201 c to AC power supplies 261 is to have flexibility to allow AC-DC regulators 201 a-201 c receiving electricity from either of AC power supplies 261 a or 261 b. When one of AC power supplies 261 a and 261 b is out of order, multiplexers 211 will switch to another AC power supply and then AC-DC regulators can receive electricity from the another AC power supply.

Table 001 illustrates how connectors 251 of multiplexers 211a-211f are connected to AC power supplies 261 based on whether AC power supply 261a and 261b are on or off. When one of AC power supplies 261a and 261b is off, multiplexers 211a-211f will connect to the other AC power supply. When both AC power supplies 261a and 261b are on, multiplexers 211a-211f will connect to their respective default AC power supply. For readability, the default choice for multiplexers 211 are to connect to each of their own respective connectors 231 when electricity is detected. When there is no electricity detected, multiplexers 211 are to connect to each of their own respective connectors 241. When both AC power supply 261a and 261b are off, there is no electricity being supplied.

211a and 211b then connect to the live wires and neutral wires of AC power supply 261a respectively. Multiplexers 211c and 211e then connect to the live wires of AC power supply 261b and multiplexers 211d and 211f then connect to the neutral wires of AC power supply 261b. As a result, AC-DC regulators 201a receives electricity from AC power supply 261a while AC-DC Regulators 201b-201c receive electricity from AC power supply 261b.

TABLE 001

| | Both AC power supplies 261a and 261b are not providing electricity | AC power supplies 261a is providing electricity and AC power supplies 261b is not providing electricity | AC power supplies 261a is not providing electricity and AC power supplies 261b is providing electricity | Both AC power supplies 261a and 261b are providing electricity |
|---|---|---|---|---|
| AC electricity sensor 221a detects: | no electricity | no electricity | electricity | electricity |
| AC electricity sensor 221b detects: | no electricity | no electricity | electricity | electricity |
| 211a is connected to: | AC power supply 261b | AC power supply 261b | AC power supply 261a | AC power supply 261a |
| 211b is connected to: | AC power supply 261b | AC power supply 261b | AC power supply 261a | AC power supply 261a |
| 211c is connected to: | AC power supply 261a | AC power supply 261b | AC power supply 261a | AC power supply 261b |
| 211d is connected to: | AC power supply 261a | AC power supply 261b | AC power supply 261a | AC power supply 261b |
| 211e is connected to: | AC power supply 261a | AC power supply 261b | AC power supply 261a | AC power supply 261b |
| 211f is connected to: | AC power supply 261a | AC power supply 261b | AC power supply 261a | AC power supply 261b |
| AC-DC regulator 201a: | is not in operation | converts AC current from AC power supply 261a to DC current | converts AC current from AC power supply 261b to DC current | converts AC current from AC power supply 261a to DC current |
| AC-DC regulator 201b: | is not in operation | converts AC current from AC power supply 261a to DC current | converts AC current from AC power supply 261b to DC current | converts AC current from AC power supply 261b to DC current |
| AC-DC regulator 201c: | is not in operation | converts AC current from AC power supply 261a to DC current | converts AC current from AC power supply 261b to DC current | converts AC current from AC power supply 261b to DC current |

In one example illustrated in Table 001, AC power supply 261a is providing electricity and AC power supply 261b is not. AC electricity sensor 221a then detects electricity and controls multiplexers 211a and 211b to connect to the live wires and neutral wires of AC power supply 261a respectively. More specifically, connector 251a connects to connector 231a and connector 251b connects to connector 231b. AC electricity sensor 221b cannot detect any electricity and then control multiplexers 211c and 211e connect to the live wires of AC power supply 261a and multiplexers 211d and 211f connect to the neutral wires of AC power supply 261a. More specifically, connector 251c connects to connector 241c; connector 251d connects to connector 241d; connector 251e connects to connector 241e; connector 251f connects to connector 241f. As all multiplexers 211a-211f connect to AC power supply 261a, AC-DC Regulators 201a-201c receive power from AC power supply 261a.

When AC power supplies 261a-261b are both supplying electricity, AC electricity sensor 221a-221b both detect electricity from AC power supplies 261a-261b. Multiplexers When AC power supplies 261a-261b are both off, there is no electricity provided to all the components of PBPSD 101, including OR-ing circuit 260.

VMCs 253 and CMCs 254 are used to measure voltage and current of electricity provided to OR-ing circuit 260 through AC-DC regulators 201 respectively. The measurements are sent to a processing unit in power controller module 102 for processing. Based on the measurements, the processing unit is able to determine, according to power policy, whether an AC-DC regulator is in operation and its loading. When the amount of current provided by the AC-DC regulator is approaching or more than the recommended rating, the AC-DC regulator is considered to be overloaded. In such case, the processing unit may shut down the overloaded AC-DC regulator temporality according to the configuration provided by power policy. Before shutting down an AC-DC regulator, the processing unit is preferred to estimate the impact on other AC-DC regulators as the other AC-DC regulators may then have higher loadings and cause instability and hazard. In one variant, when the processing unit has determined an AC-DC regulator is overloaded, the processing unit may lower TMP and disable the electricity delivery to some of power ports and/or some parts of PBPSD 101. Optionally, the processing unit will send out a message to a remote management server or an administrator about the overload and seek confirmation before changing TMP and/or ceasing providing electricity to some of the power ports and/or some parts of PBPSD 101. Alternatively, the processing unit sends out a message to inform the remote management server or the administrator about the change of TMP and/or the ceasing of providing electricity to some of the power ports and/or some parts of PBPSD 101.

VMC 256 and CMC 255 are used for measuring output voltage and current from OR-in circuit 260, i.e. the voltage and current of electricity provided by OR-ing circuit 260 to power controller module 102.

In one variant, a power policy configures the amount of current provided by an AC-DC regulator that causes the AC-DC regulator to be overloaded. For example, the recommended rating of the AC-DC regulator is ten amperes, the power policy may configure PBPSD 101 to consider the AC-DC regulator is overloaded when more than nine amperes is being drawn from the AC-DC regulators.

Figure 4:
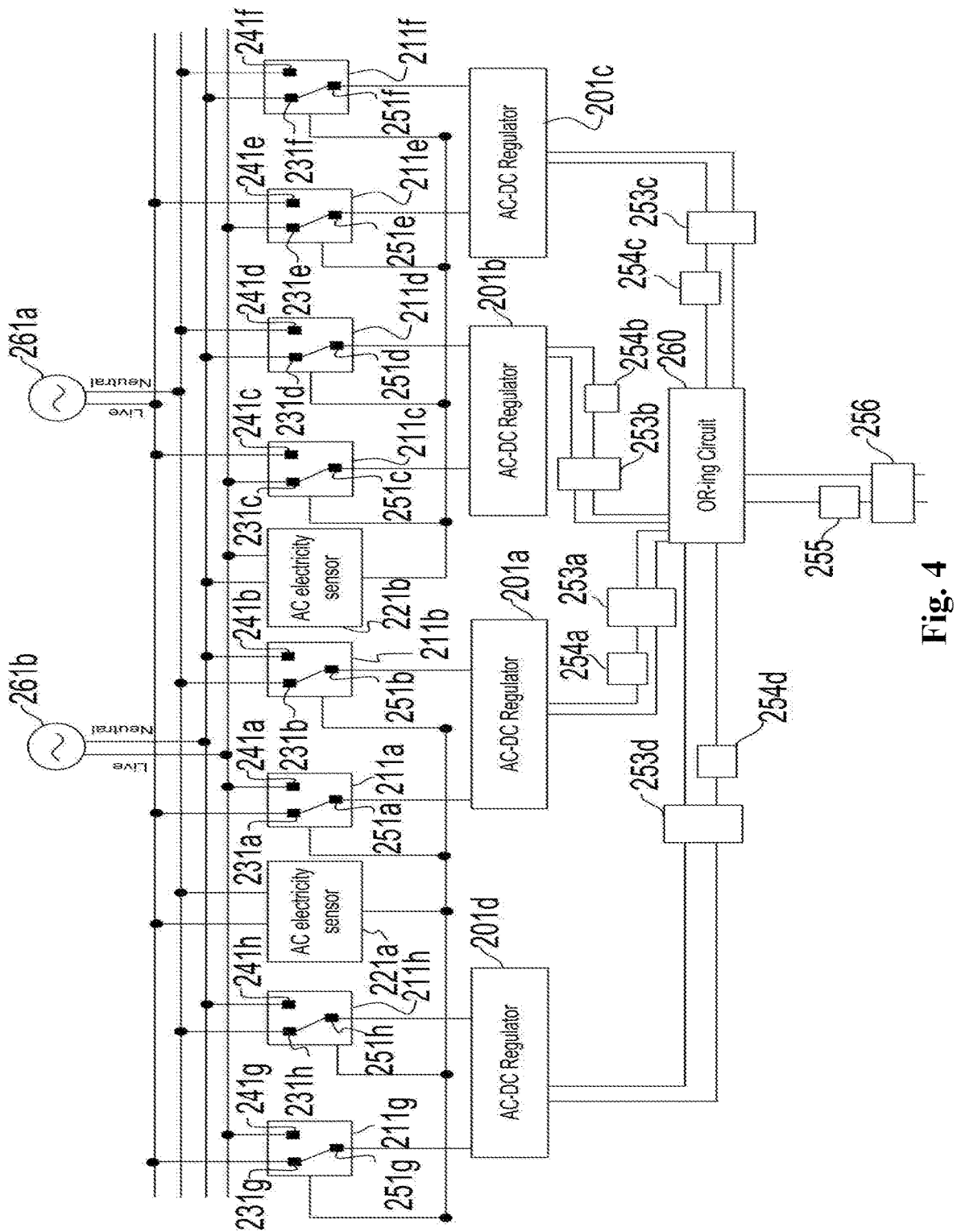
FIG. 4 illustrates a circuit schematic diagram of PBPSD 101 according to one of the embodiments of the present invention.

There is no limitation to the number of AC power supplies that can be connected to OR-ing circuit 260 through multiplexers and AC-DC regulators. There is also no limitation to the number of AC-DC regulators that can be used for converting AC current to DC current and connected to OR-ing circuit 260. There is also no limitation to the ratio of the number of AC power supplies to the number of AC-DC regulators. When there are more AC-DC regulators, more redundancy can be achieved and power load-balancing can be achieved. When the AC-DC regulators are not being used close to their recommended level, the AC-DC regulators are likely to have longer service life. For example, FIG. 4 illustrates another embodiment based on the embodiment illustrated in FIG. 3. The embodiment in FIG. 4 demonstrates that more AC-DC regulators can be added, such as AC-DC regulator 201 *d*. AC-DC regulator 201 disconnected to multiplexers 211 *g* and 211 *h* and is also controlled by AC electricity sensor 221 *a*. The addition of AC-DC regulator 201 *d* reduces loading of AC-DC regulator 201 *a* as both are defaulted to receiving electricity from AC power supply 261 *a* when AC power supply 261 *a* is providing electricity. AC-DC regulators 201 *a* and 201 *d* will only receive electricity from AC power supply 261 *b* when AC power supply 261 *a* is not providing electricity.

For illustration purposes only, when there is adequate voltage applied to the respective selector pins of multiplexers 211 *a*-211 *f* and multiplexers 211 *g*-211 *h* in FIG. 4, connectors 251 *a*-251 *h* will connect to the left connections respectively, i.e. 231 *a*-231 *h*. When there is inadequate or no voltage applied to the respective selector pins of multiplexers 211 *a*-211 *h*, connectors 251 *a*-251 *h* will connect to the right connections respectively, i.e. 241 *a*-241 *h*. There is no limitation that connectors 251 *a*-251 *h* must connect to the connections at the left. Further, a multiplexer is not limited to two inputs, i.e. connectors 231 and 241, and one output, i.e. connectors 251. In one variant, multiplexers 211 *a* and 211 *b* are replaced with a multiplexer that has one control, four inputs and two outputs.

Figure 7:
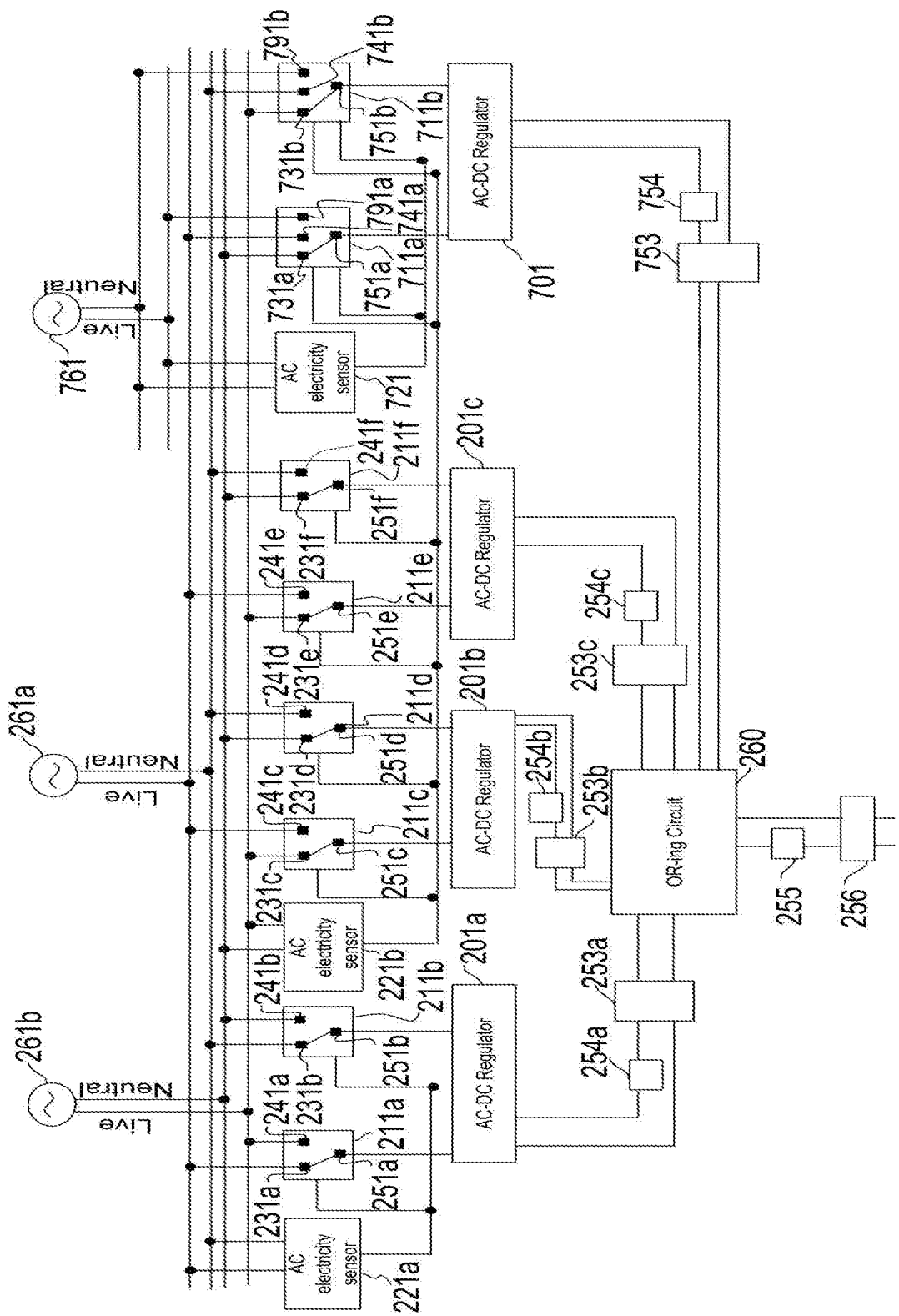
FIG. 7 illustrates a circuit schematic diagram of PBPSD 101 according to one of the embodiments of the present invention.

In one variant illustrated in FIG. 7, PBPSD 101 has additional power supply 761, AC electricity sensor 721, multiplexers 711*a*-711*b*, AC-DC regulator 701, VMC 753 and CMC 754 comparing to the embodiment illustrated in FIG. 3. In this variant, OR-ing circuit 260 can then receive DC current from four AC-DC regulators simultaneously; AC-DC regulator 701 is able to convert AC current originated from one of power supplies 261*a*, 261*b* and 761 to DC current. Therefore, more electricity supply can be added while increasing reliability.

AC electricity sensor 721 detects whether there is current provided by power supply 761. Selector pins of multiplexers 711 are connected to outputs of AC electricity sensor 721 and 221 *b*. Therefore, multiplexers 711 selects power supplies 261 *a*, 261 *b* or 761 based on whether power supplies 261 *b* and 761 are providing electricity. For illustration purposes, when power supply 761 provides electricity, output of AC electricity sensor 721 will be high and multiplexers 711 will select power supply 761. In more details, connectors 751 *a* and 751 *b* will then connect to connectors 791 *a* and 791 *b* respectively. Connectors 791 *a* and 791 *b* are connected to live and neutral wires of power supply 761 respectively. When power supply 761 is not providing electricity and power supply 261 *b* is providing electricity, output of AC electricity sensor 721 will be low, output of AC electricity sensor 221 *a* will be high and multiplexers 711 will select power supply 261 *b*. In more details, connectors 751 *a* and 751 *b* will then connect to connectors 731 *a* and 731 *b* respectively. When both power supplies 261 *b* and 761 are not providing electricity, output of AC electricity sensors 221 *a* and 721 will be low. Multiplexers 711 will by default select power supply 261 *a*. In more details, connectors 751 *a* and 751 *b* will then connect to connectors 741 *a* and 741 *b* respectively. There is no limitation that multiplexers 711 must be connected to power supplies 261 *a*, 261 *b* and 761 as discussed. There is also no limitation that multiplexers 711 must be connected to AC electricity sensors 221*b* and 721 as discussed. For example, instead of using output of AC electricity sensor 221 *b*, output of AC electricity sensor 221 *a* can be connected to one of the selector pins of multiplexers 711.

The outputs of multiplexers 711 are connected to the input of AC-DC regulator 701 for converting current to DC current. VMC 753 and CMC 754 are used to measure voltage and current of the DC current from AC-DC regulator 701.

Figure 8:
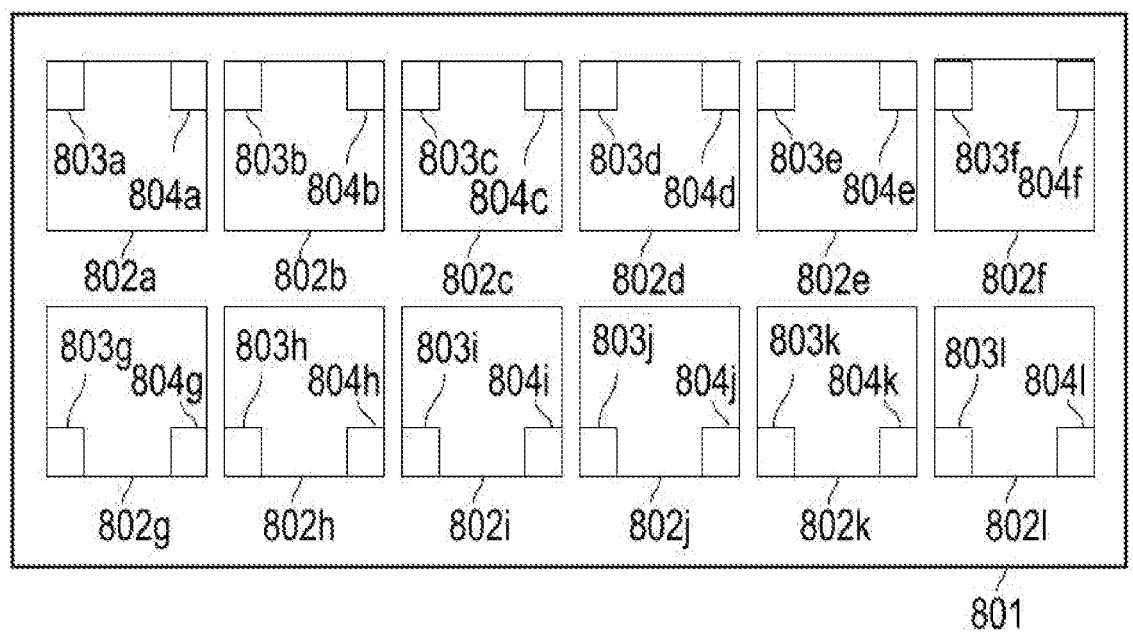
FIG. 8. illustrates one of graphical user interface (GUI) embodiments for monitoring status of power ports according to the present invention.

FIG. 8 illustrates one of graphical user interface (GUI) embodiments for monitoring status of power ports according to the present invention. Panel 801 is a graphical figure that is shown on a screen or display of an electronic device. Panel 801 may be shown in a web page, mobile phone application, or software application. Panel 801 comprises a plurality of graphical illustrations of power port 802. Each of power port 802 comprises one left indicator 803 and one right indicator 804. Left indicator 803 and right indicator 804 are used to inform a user or an administrator of status of corresponding power port 802. There are myriad ways of using left indicators 803, right indicators 804 and power ports 802 individually or collectively to indicate different status of each of power port 130.

For illustration purposes, when left indicator 803 *a* is painted with green color, it is an indication that power port 802 *a* is receiving data; when right indicator 804 *a* is in blue color, it is an indication that power port 802 *a* is supplying electricity to an electronic device coupled to power port 802 *a*. Further, graphical images can be put overlaying ports 802. For illustration purposes, when power port 802 *b* is supplying more current than the current allowed in Power over Ethernet standard, a flash symbol is painted overlaying power port 802 *b*. In another illustration, when power port 802 *c* is not being used, it is painted with black color.

In one variant, panel 801 is further being used a configuration tool. For illustration purposes, when a user clicks on power ports 802 *j*, the user is then able to configure corresponding power port 130. The configuration includes priority, voltage level, current limit, power limit, name, and time of operation.

In one variant, instead of illustrating a power port, the GUI illustrates image or photo of the device coupled to a power port. This may improve usability for configuring power ports.

Figure 9:
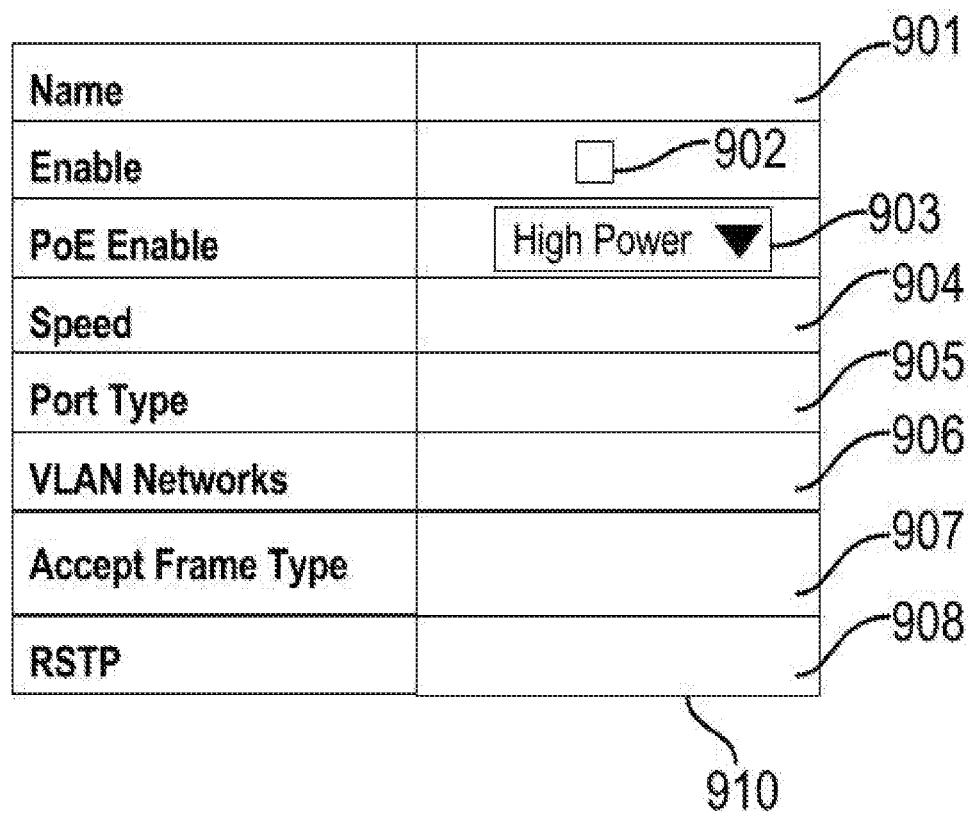
FIG. 9 illustrates one of embodiments of a power port according to the present invention.

FIG. 9 illustrates one of embodiments of a power port according to the present invention. Form 910 is a graphical user interface that allows a user or an administrator to configure a power port. When one of power ports 802, for example power port 802*b*, is clicked, form 910 is then appeared in the screen or became in focus to allow the user or the administrator to configure the corresponding power port 130. There is no limitation of number of fields 901-908 and input type for form 910. Field 901 is for entering a name for power port 802*b*. When checkbox 902 is checked, power port 130*b* is enabled and capable of providing networking capabilities and electricity through PoE technique. On the other hand, when checkbox 902 is not checked, power port 130*b* does not provide networking capabilities and electricity. In one variant, there are two separate checkboxes for enabling networking capabilities and enabling electricity supply using PoE technique respectively.

Listbox 903 allows the user or the administrator to choose different electricity supply voltages and maximum amounts of current to be supplied. For illustration purposes, when high power is selected, the electricity supply voltage at power port 130 *b* is set to 50 volts and the maximum about of current allowed is 20 amperes; when low power is selected, the electricity supply voltage at power port 130 *b* is set to 50 volts and the maximum amount of current allowed is 20 amperes. In one variant, listbox 903 allows the user or the administrator to specify or enter a supply voltage value and the maximum amount of current allowed.

Field 904 allows the user or the administrator to select connection speed of power port 130*b*. For illustration, the user or the administrator can select power port 130*b* to be 100 Mbps or 1000 Mbps. Field 905 allows a port type to be selected. Field 906 allows the user or the administrator to select virtual local area network (VLAN) type. Field 907 allows the user or the administrator to configure power port 130*b* to accept only tagged frames. Field 908 is for enabling or disabling Rapid Spanning Tree Protocol (RSTP).

There is no limitation to the type and numbers of fields that can be configured through a user interface. For example, form 910 can also be used to configure a power port that is a serial port.

For example, priority of receiving electricity can be configured such that the power port can be assigned whether to receive electricity when there is not enough current or power supplied to PBPSD 101. In another example, an additional field is added to form 910 to allow the administrator of PBPSD 101 to assign a numerical value for priority. When there is not enough current or power, power port assigned with a higher numerical value has higher priority to receive electricity than a power port assigned with a lower numerical value. There is also no limitation that power ports are CAT 5 interface ports.

The embodiments were chosen and described in order to best explain the principles of the invention and its practical applications, to thereby enable others skilled in the art to best utilize the invention and various embodiments with various modifications as are suited to the particular use contemplated.

The invention claimed is:

1. A DC current supply circuit, comprising:
   a. a plurality of power connectors;
   b. a first plurality of multiplexers;
   c. a second plurality of multiplexers;
   d. a plurality of alternating current to direct current (AC-DC) regulators; and
   e. an OR-ing circuit;
   wherein inputs of each multiplexer in the first plurality of multiplexers are connected to live wires of at least two power connectors in the plurality of power connectors and wherein each output of each multiplexer in the first plurality of multiplexers is connected to an input of a corresponding AC-DC regulator in the plurality of AC-DC regulators;
   wherein inputs of each multiplexer in the second plurality of multiplexers are connected to neutral wires of at least two power connectors in the plurality of power connectors and wherein each output of each multiplexer in the second plurality of multiplexers is connected to an input of a corresponding AC-DC regulator in the plurality of AC-DC regulators;
   wherein each selector pin of the first plurality of multiplexers is connected to an output of a corresponding alternating current (AC) current sensor;
   wherein each selector pin of the second plurality of multiplexers is connected to an output of a corresponding AC current sensor;
   wherein outputs of the corresponding AC-DC regulators are connected to the OR-ing circuit;
   wherein each of the AC current sensors connects to a respective live wire and a respective neutral wire of one power connector in the plurality of power connectors; and
   wherein the number of AC-DC regulators in the plurality of AC-DC regulators is more than the number of power connectors in the plurality of power connectors.

2. The DC current supply circuit of claim 1, wherein the AC current sensors are optocouplers.

3. The DC current supply circuit of claim 1, wherein each output of the AC-DC regulators is connected to a corresponding direct current (DC) voltage measurement circuit for generating DC voltage information describing an amount of DC voltage measured.

4. The DC current supply circuit of claim 3, wherein each output of the AC-DC regulators is connected to a corresponding DC current measurement circuit for generating DC current information describing an amount of current measured.

5. The DC current supply circuit of claim 4, further comprising a processing unit and a non-transitory computer readable storage medium, wherein the processing unit receives the DC voltage information and DC current information.

6. The DC current supply circuit of claim 5, further comprising:
   a plurality of AC voltage measurement circuits for generating AC voltage information describing an amount of voltage measured in a plurality of AC power supplies; and
   a plurality of AC current measurement circuits for generating AC current information describing an amount of current measured in the plurality of AC power supplies.

7. The DC current supply circuit of claim 6, wherein the processing unit determines status of each AC power supply in the plurality of AC power supplies, based on the AC voltage information and the AC current information.

8. The DC current supply circuit of claim 5, wherein the processing unit further provides data connectivity for a plurality of power ports.

9. The DC current supply circuit of claim 5, wherein the processing unit further determines whether to provide electricity to one or more power connector in the plurality of power connectors, based on the DC voltage information and DC current information.

10. An apparatus for providing data connectivity and electricity to devices, comprising:
   at least one processing unit;
   at least one non-transitory computer readable storage medium for storing program instructions;
   a plurality of power connectors;
   a plurality of alternating current to direct current (AC-DC) regulators;
   an OR-ing circuit; and
   a plurality of power ports;
   wherein the OR-ing circuit receives DC currents from outputs of AC-DC regulators in the plurality of AC-DC regulators;
   wherein the OR-ing circuit provides DC current to the plurality of power ports;
   wherein the AC-DC regulators are connected to the plurality of power connectors through a plurality of multiplexers; and
   wherein the number of AC-DC regulators is more than the number of the plurality of power connectors.

11. The apparatus of claim 10, further comprising: a plurality of voltage and current measurement circuits, wherein each of the plurality of voltage and current measurement circuits is connected to a corresponding output of the plurality of AC-DC regulators.

12. The apparatus of claim 11, wherein the at least one non-transitory computer readable storage medium further stores program instructions executable by the at least one processing unit and configured to disable at least one of the plurality of power ports when at least one of the AC-DC regulators is overloaded.

13. The apparatus of claim 10, wherein the plurality of power ports is capable of providing data connectivity.

14. The apparatus of claim 10, wherein a power port in the plurality of power ports is capable of providing data connectivity when the power port is not used to provide electricity.

15. The apparatus of claim 10, wherein the processing unit receives a power policy from a remote server for managing power ports.

16. The apparatus of claim 10, wherein the apparatus is an Ethernet switch.

17. The apparatus of claim 10, wherein the apparatus is an Internet router.

\* \* \* \* \*